US008214169B2

(12) United States Patent
Bhavnagarwala et al.

(10) Patent No.: US 8,214,169 B2
(45) Date of Patent: Jul. 3, 2012

(54) CIRCUITS AND METHODS FOR CHARACTERIZING RANDOM VARIATIONS IN DEVICE CHARACTERISTICS IN SEMICONDUCTOR INTEGRATED CIRCUITS

(75) Inventors: Azeez Bhavnagarwala, Newton, CT (US); David J. Frank, Yorktown Heights, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 984 days.

(21) Appl. No.: 10/643,193

(22) Filed: Aug. 18, 2003

(65) Prior Publication Data

US 2005/0043908 A1 Feb. 24, 2005

(51) Int. Cl.
*G01D 18/00* (2006.01)
(52) U.S. Cl. .............................. 702/117; 702/64; 702/85
(58) Field of Classification Search ................... 702/57, 702/58, 64, 65, 66, 85, 182, 117, 189
See application file for complete search history.

(56) References Cited

U.S. PATENT DOCUMENTS

| 4,851,768 | A | * | 7/1989 | Yoshizawa et al. | 324/751 |
| 5,999,043 | A | * | 12/1999 | Zhang et al. | 327/558 |
| 6,161,213 | A | * | 12/2000 | Lofstrom | 716/4 |
| 6,181,621 | B1 | * | 1/2001 | Lovett | 365/205 |
| 6,275,094 | B1 | * | 8/2001 | Cranford et al. | 327/534 |
| 6,628,146 | B2 | * | 9/2003 | Tam | 327/63 |
| 6,731,916 | B1 | * | 5/2004 | Haruyama | 455/194.2 |
| 6,798,278 | B2 | * | 9/2004 | Ueda | 327/541 |
| 6,819,183 | B1 | * | 11/2004 | Zhou et al. | 330/289 |
| 2004/0193390 | A1 | * | 9/2004 | Drennan et al. | 703/2 |

OTHER PUBLICATIONS

Conti et al., "Test structure for mismatch characterization of MOS transistors in subthreshold regime", Proceedings of the IEEE 1997 Int Conference on Microelectronic Test Structures, vol. 10, Mar. 1997.*
Bastos et al., "Mismatch characterization of small size MOS transistors", Proceedings of the IEEE 1995 Int. Conference on Microelectronic Test Structures, vol. 8, Mar. 1995.*
Shen et al., "Down Literal Circuit with Neuron-MOS Transistors and Its Applications", Proceedings. 1999 29th IEEE International Symposium on Multiple-Valued Logic, May 20-22, 1999 pp. 180-185.*

(Continued)

*Primary Examiner* — Jeffrey R West
(74) *Attorney, Agent, or Firm* — F. Chau & Associates, LLC; Anne V. Dougherty, Esq.

(57) ABSTRACT

Circuits and methods for measuring and characterizing random variations in device characteristics of semiconductor integrated circuit devices, which enable circuit designers to accurately measure and characterize random variations in device characteristics (such as transistor threshold voltage) between neighboring devices resulting from random sources such as dopant fluctuations and line edge roughness, for purposes of integrated circuit design and analysis. In one aspect, a method for characterizing random variations in device mismatch (e.g., threshold voltage mismatch) between a pair of device (e.g., transistors) is performed by obtaining subthreshold DC voltage characteristic data for the device pair, and then determining a distribution in voltage threshold mismatch for the device pair directly from the corresponding subthreshold DC voltage characteristic data. The voltage threshold mismatch distributions of different device pairs of a given circuit design can then be used to determine voltage threshold variations of the constituent circuit devices. The voltage threshold variation of the devices can be used to characterize the random variations of the given circuit.

11 Claims, 9 Drawing Sheets

OTHER PUBLICATIONS

Lakshmikumar et al., "Characterization and Modeling of Mismatch in MOS Transistors for Precision Analog Design", IEEE Journal of Solid-State Circuits, vol. 21, Issue: 6, Dec. 1986.*

Pavasovic et al., "Characterization of Subthreshold MOS Mismatch in Transistors for VLSI Systems", Journal of VLSI Signal Processing, 8, 75-85, 1994.*

Bhavnagarwala et al., "The Impact of Intrinsic Device Fluctuations on CMOS SRAM Cell Stability", IEEE Journal of Solid-State Circuits, vol. 36, No. 4, Apr. 2001.*

Michael Stutz, "More on spectrum analysis: Mixed-Frequency AC Signals". pp. 1-11. Copyright 1999-2000. http://www.allaboutcircuits.com/vol_2/chpt_7/4.html.*

* cited by examiner $$V_{in} = V_{dd} - V_{out} + (V_{TN2} - V_{TN1}) +$$

$$\frac{\eta}{\beta} \ln \left| \frac{k_{N1}}{k_{N2}} \right| + \frac{\eta}{\beta} \ln \left| \frac{1 - e^{-\beta(V_{dd} - V_{out})}}{1 - e^{-\beta(V_{out})}} \right|$$

$$k_{N1} = \frac{W_{N1}}{L_{N1}} \mu_{on} C_{ox} \frac{\eta}{\beta^2} \quad k_{N2} = \frac{W_{N2}}{L_{N2}} \mu_{on} C_{ox} \frac{\eta}{\beta^2}$$

II $$V_{in} = V_{out} - (V_{TP2} - V_{TP1}) -$$

$$\frac{\eta}{\beta} \ln \left| \frac{k_{P1}}{k_{P2}} \right| - \frac{\eta}{\beta} \ln \left| \frac{1 - e^{-\beta(V_{dd} - V_{out})}}{1 - e^{-\beta(V_{out})}} \right|$$

$$k_{P1} = \frac{W_{P1}}{L_{P1}} \mu_{op} C_{ox} \frac{\eta}{\beta^2} \quad k_{P2} = \frac{W_{P2}}{L_{P2}} \mu_{op} C_{ox} \frac{\eta}{\beta^2}$$

FIG. 6

III $$V_{in} = \frac{V_{dd}}{2} - \frac{V_{tN1} - |V_{tP1}|}{2} +$$

$$\frac{\eta}{2\beta} \ln \left| \frac{k_{P1}}{k_{N1}} \right| + \frac{\eta}{2\beta} \ln \left| \frac{1 - e^{-\beta(V_{dd} - V_{out})}}{1 - e^{-\beta V_{out}}} \right|$$

$$k_{P1} = \frac{W_{P1}}{L_{P1}} \mu_{op} C_{ox} \frac{\eta}{\beta^2} \quad k_{N1} = \frac{W_{N1}}{L_{N1}} \mu_{on} C_{ox} \frac{\eta}{\beta^2}$$

FIG. 7a

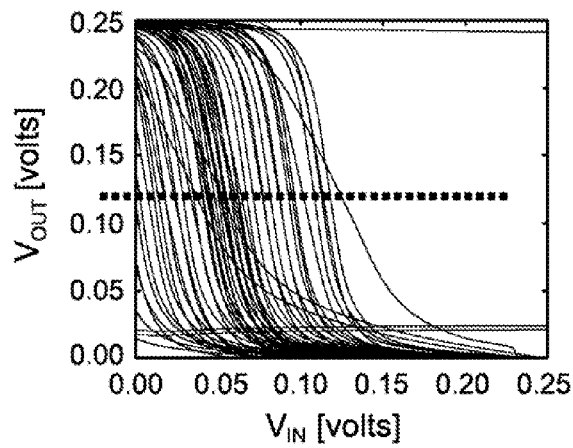

FIG. 7b

CIRCUITS AND METHODS FOR CHARACTERIZING RANDOM VARIATIONS IN DEVICE CHARACTERISTICS IN SEMICONDUCTOR INTEGRATED CIRCUITS

TECHNICAL FIELD OF THE INVENTION

The present invention relates generally to circuits and methods for measuring and characterizing random variations in device characteristics in semiconductor devices. The present invention further relates to circuits and methods for measuring and characterizing device mismatch of semiconductor transistors due to local variations in device characteristics resulting from random sources, and in particular, Vt (threshold voltage) variations between neighboring MOSFETs (Metal Oxide Semiconductor Field Effect Transistors) of SRAM (Static Random Access Memory) cells or other logic devices.

BACKGROUND

In the design of semiconductor integrated circuits, it is very important to consider variations in device characteristics (device mismatch) such as Vt (threshold voltage) for a given circuit design, in order to achieve circuit robustness and obtain high manufacturing functional yields for such devices.

In general, variations in device characteristics include "systematic" variations and "random" variations. Systematic variations (or process variations) are variations in a manufacturing process that equally affect some or all N-doped or P-doped elements of a local circuit depending on, e.g., the orientation, geometry and/or location of a device. For example, when manufacturing a semiconductor chip, systematic variations in device characteristics can result from variations in mask dimensions (which causes geometry variations), variations in material properties of wafers, resists, etc., variations in the manufacturing equipment and environment (e.g., lens aberrations, flow turbulence, oven temperature, etc.) and variations in process settings (implant dose, diffusion time, focus, exposure energy, etc.). Systematic variations typically have significant spatial correlations, i.e., circuits/devices that are near each other can be expected to have the same/similar amount of variations due to systematic sources of variation.

Given the high spatial correlation for systematic variations in device characteristics between local devices, body biasing methods for compensating/mitigating the sensitivity of circuit performance due to such systematic variations are well known and can be readily applied.

In contrast, random variations in device characteristics between devices of a circuit, wafer, chip or lot, are uncorrelated. Random sources of variations, which cause device mismatch between neighboring devices in a circuit, can adversely affect circuit behavior even more drastically that systematic variations in circuits such as SRAM cells and sense amplifiers. Indeed, since systematic sources of variation equally affect neighboring devices, device mismatch between neighboring devices as a result of systematic sources is negligible as compared to device mismatch due to random sources of device characteristic variation. Thus, random variations in device characteristics (device mismatch) cause significantly more deviation especially in circuit performance of the above mentioned circuits, than systematic variations. Since random variations in device characteristics are uncorrelated, methods for characterizing or modeling such random variations are difficult and inaccurate. Providing the necessary "fixes" at the device and circuit levels so as to limit the adverse effects of such random variations on circuit performance, are expansive by way of silicon area consumed as compared to those for systematic variations.

Although device mismatch may be caused by any number of variations in device characteristics, random variations in Vt (threshold voltage) mismatch have significant impact on circuit performance for various types of MOS circuits. In MOSFET devices, for example, random variations in Vt between neighboring transistors are due primarily to fluctuations in number and position of dopant atoms, but other sources include, for example, randomness in line edge roughness of devices. Variations in Vt mismatch of MOSFETs of an SRAM cell can significantly degrade cell stability as is understood by those of ordinary skill in the art. Furthermore, Vt mismatches of transistors of a sense amplifier can adversely impact the offset voltage. In particular, because a sense amplifier senses a differential voltage applied at the gates of two neighboring sensing devices (transistors), if there is a Vt mismatch between such devices, the mismatch adds to the voltage that the sense amplifier must counter before it can amplify the desired signal. By way of further example, Vt mismatches can affect the performance of CMOS inverters, e.g., a Vt mismatch can cause variations in the trip voltage, that is, the point at which the output of the inverter switches between logic states "1" and "0".

As semiconductor integrated circuits become more highly integrated with sub-micron features sizes of MOS devices, and as power supply voltages are reduced (for low power applications), the adverse effects of circuit performance due to random variations in device mismatch are enhanced because such variations do not scale down with feature size and/or supply voltage.

Accordingly, in order to provide robust circuit designs and enhance functional yield for a given process, circuit designers will try to accurately assess/characterize the random contributions of device mismatch, such as Vt mismatch, for example, that results from a given fabrication process so as to determine the effects of such random variations on circuit performance.

Various simulations and experimental methods have been proposed and developed for characterizing variations in device characteristics to determine the effect of device mismatch in integrated circuit design. In general, such methods are based on statistical analysis or statistical modeling of device mismatches and performance differences that result from device mismatch. Statistical design methods enable a circuit designer to determine the quantitative effect of device mismatch.

For instance, CAD (computer-aided design) tools and applications have been developed for statistical circuit design and performing statistical simulations using Monte Carlo analysis. Monte Carlo simulation requires construction of a statistical model of device mismatch, for example, which model is used for simulating device mismatch. In general, with Monte Carlo analysis, parameter distributions (e.g., Normal/Guassian) are assigned to desired model parameters and then Monte Carlo simulations are performed using such parameter distributions.

There are various disadvantages associated with methods such as Monte Carlo simulations. For instance, the characterization accuracy of such methods are limited based on the accuracy of the model that is employed. Moreover, such simulations typically do not capture all the sources of Vt mismatch. Moreover, Monte Carlo simulations are expensive in terms of time and effort to develop.

Experimental techniques for characterizing device mismatch include performing statistical analysis on actual test
} data that is measured from test structures. For example, FIG. 1 is a diagram that illustrates a conventional test circuit and method for characterizing device mismatch. The test circuit of FIG. 1 comprises an array of NFETs or PFETs, wherein all the source terminals of the transistors in the array are commonly connected to terminal "S". The gate terminals of the transistors in a given column of the array (10) are commonly connected to a Gi (e.g., i=1, . . . , 256) terminal, and the drain terminals of the transistors in a given row of the array (10) are commonly connected to a Di (e.g., i=1, . . . , 32) terminal. A counter and decoder circuit (11) is responsive to a clock CLK signal for generating output signals to sequentially activate one of the Gi terminals.

With the circuit of FIG. 1, test data is collected by selectively activating the transistors, one at a time, in a given sequence, to measure the drain current ID vs. gate voltage VG (I-V) characteristics for each transistor in the array (10). For example, transistor T1 in the array (10) is activated by applying Vdd to terminals G1 and D1, and then the current flowing in terminal S would be measured to obtain the I-V characteristics of T1. Then, sequential activation of the terminals Gi and Di would continue until each device in the array is measured. For instance, D1 would be maintained at Vdd while each Gi terminal would be sequentially activated under control of the counter (11) to obtain the I-V characteristics in the first row of the array (10), and this process would be repeated by sequentially activating G1-Gi for each activated row Di.

After the I-V measurements are collected for all the transistors in the array (10) and stored in a database, the data can be retrieved and processed to extract various parameters such a Vt, transconductance, drain currents, etc. and generate distributions for such parameters. In addition, the Vt of neighboring devices in the array could be compared to generate a distribution of the Vt mismatch between neighboring devices. Assuming that the transistors in the array are the same (e.g., the same channel lengths and widths), the measured distributions can be used to characterize device mismatch between the same or similar transistors to be included in a desired circuit design.

Although techniques which characterize device mismatch based on actual test data measured using test structures (such as in FIG. 1) can effectively determine parameter mismatch variance to some degree, uncertainty can be included in the test data as a result of variations from sources from other than the MOSFET being characterized, which result from the testing procedure and/or testing circuit architecture, can reduce the accuracy of device mismatch analysis. For example, in the test circuit of FIG. 1, test data that is measured for a given transistor includes uncertainty resulting from gate leakage and subthreshold leakage from unselected devices in the activated row and column.

More specifically, by way of example, when terminals G1 and D1 are activated (at Vdd) to collect data for transistor T1, the unselected transistors (T2 . . . T3) in the row D1 drive subthreshold leakage currents (current that flows from the drain to source terminal when gate voltage is below the threshold voltage), which contribute to variations in the drain current Id of transistor T1 that is being measured in terminal S. Furthermore, the unselected transistors (e.g., T4, T5) in column G1 drive gate leakage current (leakage through gate oxide from gate terminal to source terminal), which further adds to the uncertainties of the test data being measured for T1.

With the test structure of FIG. 1, other sources of variation that can add to the uncertainty include systematic (process) variations that exist when the array is too large. For instance, when the array is too large, variations in channel length of transistors in the array (10) may occur due to process variations, which contribute to parameter variations (e.g., Vt) in devices across the array (10).

Moreover, when the array is too large, the increase in temperature of the devices in the array during testing of transistors can add to the uncertainty of measured Vt, which is exponentially dependent on temperature.

Accordingly, when attempting to characterize device mismatch due to random sources, the sources of uncertainty, which result from the testing circuit and/or methodology, can contribute to the variance of the test data. As such, device mismatch due to random Vt fluctuations cannot be accurately characterized and is overestimated. This is not desirable since, as noted above, accurate characterization of random variation of device mismatch (e.g., Vt mismatch) between neighboring devices is important for circuit analysis due to the significantly adverse effects such random mismatches can have on circuit performance, functionality and yield.

Thus, it is highly desirable to develop circuits and methods that allow random Vt variations in device characteristics to be accurately and efficiently characterized for purposes of integrated circuit design.

SUMMARY OF THE INVENTION

The present invention is directed to circuits and methods for measuring and characterizing random variations in device characteristics of semiconductor integrated circuit devices. More specifically, circuits and methods according to embodiments of the invention enable circuit designers to accurately measure and characterize random variations in device characteristics (such as transistor threshold voltage (Vt)) resulting from random placement of dopant atoms or line edge roughness, for purposes of integrated circuit design. Methods and circuits according to embodiments of the invention are preferably implemented for determining variations in Vt mismatch between neighboring MOSFETs of a given circuit being analyzed/designed, such as SRAM cells or other logic devices, and using the determined variations in Vt mismatch to characterize random variations of the given circuit. Preferably, circuits and methods according to the present invention for characterizing device mismatch between transistors preferably measure subthreshold DC voltage characteristics (VC) of pairs of devices (i.e., gate voltage is below Vt), which eliminates uncertainty that arises from gate leakage through unselected devices.

In one embodiment of the invention, method for characterizing random variations in device mismatch (e.g., Vt mismatch) between neighboring devices comprises the steps of obtaining subthreshold DC voltage characteristic data (Vout vs. Vin) for a plurality of device pairs of the neighboring devices, analyzing such data to determine a distribution of Vin for a given Vout, and obtaining a distribution for Vt mismatch based on the distribution of Vin. A distribution in Vt mismatch for a pair of transistors, for example, can be directly measured using subthreshold DC voltage characteristic data that is obtained from multiple pairs of such neighboring devices.

In another embodiment of the invention, a method for characterizing device mismatch in a semiconductor integrated circuit comprises: obtaining DC voltage characteristic data for one or more selected device pairs of an integrated circuit, wherein the device pairs comprise pairs of neighboring transistors in the integrated circuit; determining a distribution of Vt (threshold voltage) mismatch for a selected device pair using corresponding DC voltage characteristic data for the device pair; determining a Vt variation of transistors in the integrated circuit using one or more determined distributions of Vt mismatch for selected device pairs; and characterizing random variations of the integrated circuit using one or more determined Vt variations of transistors of the integrated circuit. Preferably, the step of obtaining DC voltage characteristic data for a selected device pair of an integrated circuit comprises obtaining subthreshold DC voltage characteristic data while biasing the transistors of the device pair in a subthreshold region.

These and other exemplary embodiments, aspects, features, and advantages of the present invention will become apparent from the following detailed description of the preferred embodiments, which is to be read in connection with the accompanying drawings.

BRIEF DESCRIPTION OF THE DRAWINGS

FIG. 6 is an exemplary model according to an embodiment of the invention for characterizing device mismatch using the circuit of FIG. 3.

FIG. 7*a* is an exemplary model according to an embodiment of the invention for characterizing device mismatch using the circuit of FIG. 4.

FIG. 7*b* is an exemplary graphical diagram illustrating subthreshold DC voltage characteristics that were measured for a plurality of circuits as depicted in FIG. 4.

DETAILED DESCRIPTION OF PREFERRED EMBODIMENTS

In general, circuits and methods according to embodiments of the invention are used for measuring and characterizing random variations in device characteristics of semiconductor integrated circuit devices. More specifically, circuits and methods according to embodiments of the invention enable circuit designers to accurately measure and characterized random variations in device characteristics (such as transistor threshold voltage (Vt)) resulting from random sources, for purposes of integrated circuit design. Methods and circuits according to embodiments of the invention are preferably implemented for determining variations in Vt mismatch between neighboring MOSFETs of a given circuit being analyzed/designed, such as SRAM cells or other logic devices, and using the determined variations in Vt mismatch to characterize random Vt variation of the given circuit.

Figure 1:
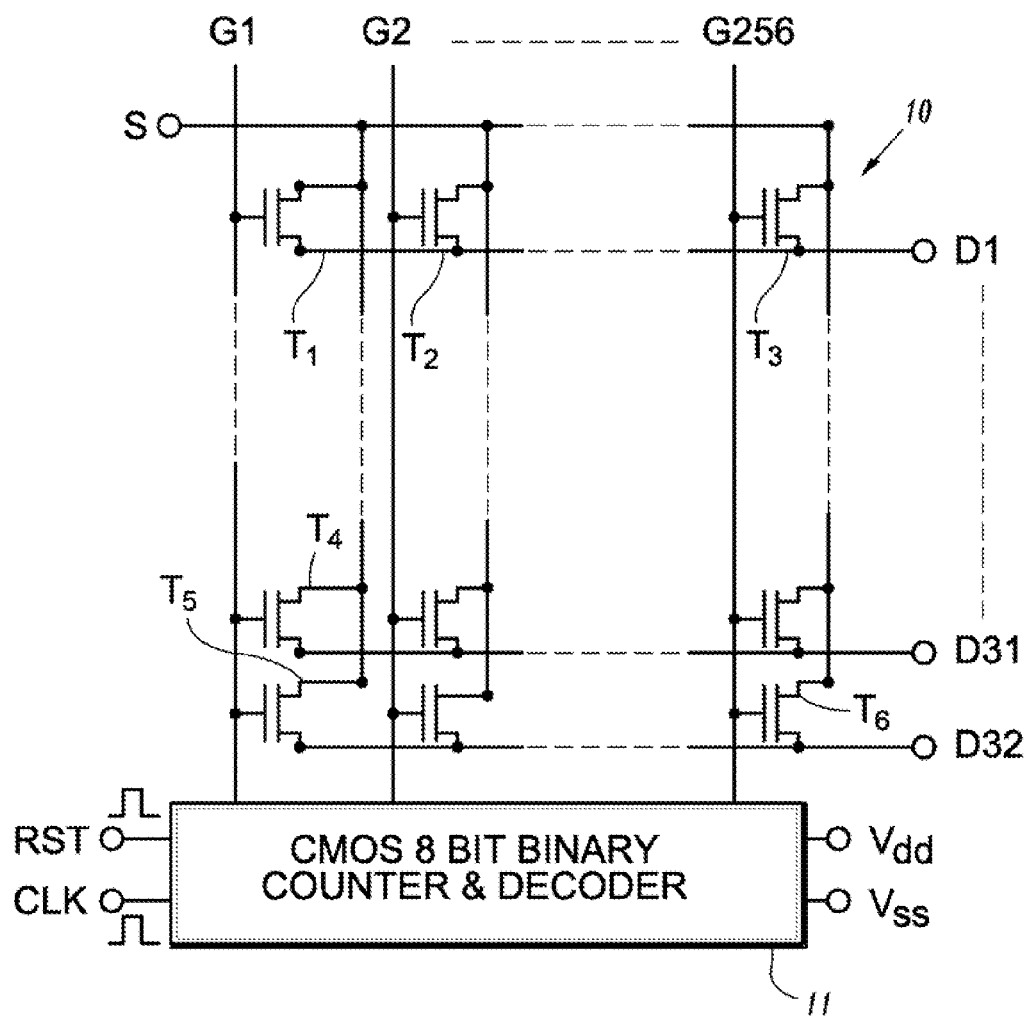
FIG. 1 is a diagram that illustrates a conventional test circuit that is used for measuring device parameters for characterizing device mismatch.

In general, circuits and methods according to the present invention for characterizing device mismatch preferably measure subthreshold DC voltage characteristics (VC) of pairs of devices, which is to be contrasted with the conventional method discussed above with reference to FIG. 1 which measures drain current $I_D$ vs. gate voltage $V_G$ of individual devices. Preferably, the DC voltage characteristic are measured in the sub threshold region (i.e., gate voltage is below Vt), which eliminates uncertainty that arises from unselected devices and gate leakage.

In accordance with an embodiment of the present invention, a method for characterizing random variations in device mismatch (e.g., Vt mismatch) between neighboring devices is performed by obtaining subthreshold DC voltage characteristic data (Vout vs. Vin) for a plurality of device pairs of the neighboring devices, analyzing such data to determine a distribution of Vin for a given Vout, and obtaining a distribution for Vt mismatch based on the distribution of Vin. In other words, a distribution in Vt mismatch for a pair of transistors, for example, can be directly measured using DC voltage characteristic data that is obtained from multiple pairs of such neighboring devices.

Figure 2:
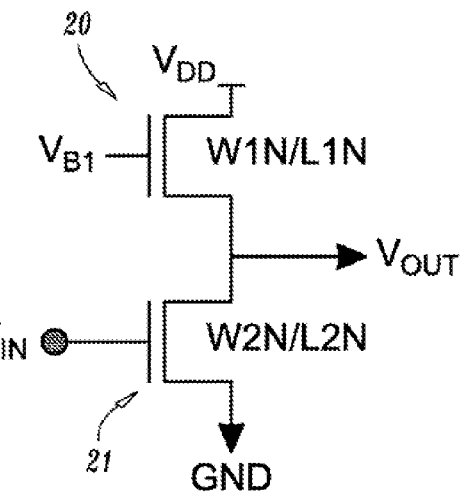
FIG. 2 is an exemplary circuit diagram that can be used for characterizing random device mismatches between a pair of transistors, according to an embodiment of the invention.
Figure 3:
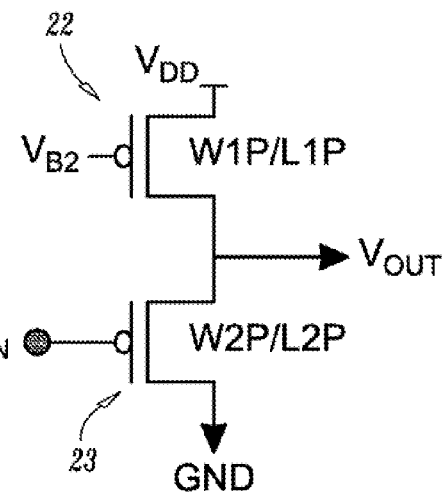
FIG. 3 is an exemplary circuit diagram that can be used for characterizing random device mismatches between a pair of transistors, according to another embodiment of the invention.
Figure 4:
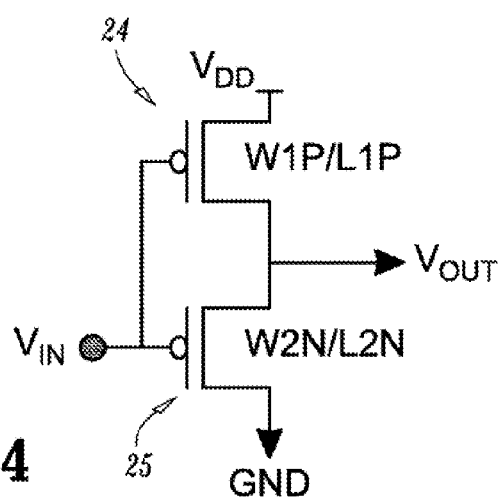
FIG. 4 is an exemplary circuit diagram that can be used for characterizing random device mismatches between a pair of transistors, according to another embodiment of the invention.

By way of example, FIGS. 2, 3 and 4 are exemplary circuit diagrams depicting circuits that can be used for characterizing random device mismatches (e.g., Vt mismatch) between MOSFETs. More specifically, FIG. 2 is an exemplary diagram illustrating a circuit comprising a pair of NMOS FETs, which can be used for measuring random Vt mismatches between NFETs. The circuit comprises a first NFET (20) having a channel width W1 and length L1, and a second NFET (21) having a channel width W2 and length L2. Further, FIG. 3 is an exemplary diagram illustrating a circuit comprising a pair of PMOS FETs, which can be used for measuring random Vt mismatches between PFETs. The circuit comprises a first PFET (22) having a channel width W1 and length L1, and a second PFET (23) having a channel width W2 and length L2. In addition, FIG. 4 is an exemplary diagram illustrating a circuit comprising a pair of MOSFETs, which can be used for measuring random Vt mismatches between an NFET and a PFET. The circuit comprises a PFET (24) having a channel width W1 and length L1, and an NFET (25) having a channel width W2 and length L2.

In general, in each of the exemplary circuits, DC voltage characteristics are measured by sweeping an input voltage, $V_{IN}$, and measuring the output voltage, $V_{out}$. More specifically, in the circuit of FIG. 2, the input voltage $V_{IN}$, which is applied to the gate terminal of NFET (21), and a constant voltage $V_{B1}$, which is applied to the gate terminal of NFET (20) are preferably selected to maintain the NFETS (20) and (21) in the subthreshold region for VDD>Vt. In addition, in the circuit of FIG. 3, the input voltage, $V_{IN}$, which is applied to the gate terminal of PFET (23), and a constant voltage, $V_{B2}$, which is applied to the gate terminal of PFET (22), are preferably selected to maintain the PFETS (22) and (23) in the subthreshold region for VDD>Vt. Further, in the circuit of FIG. 4, the input voltage, $V_{IN}$, which is applied to the gate terminals of both the PFET (24) and the NFET (25) is preferably selected to maintain the FETs (24) and (25) in the subthreshold region for VDD>Vt.

In one exemplary embodiment, the DC voltage characteristic data is measured in circuits of FIGS. 2-4 at VDD=to 250 mV or 1V, and maintaining $V_{B1}$ and $V_{B2}$ at about less than 250 mv while varying $V_{IN}$ from 0 v to about less than 250 mV. Advantageously, in the circuits of FIGS. 2-4, since the input voltages are kept low to maintain the MOSFETs in the subthreshold region, accurate characterization of Vt mismatch is achieved at full VDD, where the Vt spreads (standard deviations) would be larger. In addition, there is no contribution from gate leakage current and, as explained below, there is no contribution of unselected devices during testing. It is be appreciated that the physical orientation of the MOSFETs in FIGS. 2, 3 and 4 can be in the same direction or orthogonal.

AS noted above, characterizing device mismatch (e.g., Vt mismatch) between neighboring transistors of a given circuit can be performed using one of the circuits of FIGS. 2-4 depending on the transistor types. For example, to characterize the variation in Vt mismatch between two neighboring NFETs of a given circuit design, subthreshold DC voltage characteristic data (Vout vs. Vin) would be measured for each of a plurality of the same/similar circuits comprising device pairs as shown in FIG. 2. The DC data would then be analyzed to determine a distribution of Vin for a given Vout, and a distribution for Vt mismatch would be determined using the measured distribution of Vin.

Figures 5A, 5B:
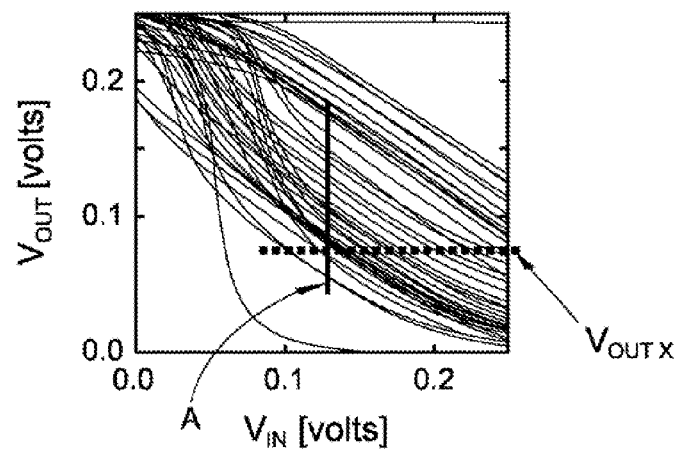
FIG. 5*a* is an exemplary model according to an embodiment of the invention for characterizing device mismatch using the circuit of FIG. 2.
FIG. 5*b* is an exemplary graphical diagram illustrating subthreshold DC voltage characteristics that were measured for a plurality of circuits as depicted in FIG. 2.

For example, FIG. 5b is an exemplary graphical diagram illustrating subthreshold DC voltage characteristics (Vout vs. Vin) that were measured for a plurality of circuits as depicted in FIG. 2. Using the data shown in FIG. 5b, a distribution of Vin was determined for a given Vout (as indicated by the dotted line). Preferably, Vout is selected to be less than 0.5 VDD. More specifically, in the exemplary diagram of FIG. 5b, Vout is preferably selected for a region (to the right of line A) where the transfer characteristics (Vout vs. Vout) are essentially linear across Vin (see dotted line). In the region of the data to the left of line A, the DC curves (Vout vs. Vin) are not linear when Vout is selected to be higher than the Vout of the dotted line, and the nonlinear portion of the DC curves reflect contributions from other transistors in the circuit.

Then, for the selected Vout, the distribution of Vt mismatch is determined using the measured distribution of Vin. More specifically, in accordance with FIG. 5a of the present invention, it has been demonstrated that the distribution of Vin corresponds to the distribution of the Vt mismatch between NFET devices. FIG. 5a depicts an analytical model for the data plotted in FIG. 5b. As shown in FIG. 5a, the distribution of Vin corresponds to the Vt mismatch between NFET devices (i.e., $Vt_{N2}-Vt_{N1}$) of FIG. 2. In FIG. 5a, η denotes the subthreshold slope factor (how quickly a device turns off as the gate voltage decreases), β denotes the reciprocal of terminal voltage (which is 26 mv at room temperature), $\mu_{on}$ denotes the low field carrier mobility, k is a coefficient (in $mA/V^2$) that denotes the ratio of $Id/(Vgs-Vt)^2$, W/L is the ratio of channel width to channel length, and $C_{ox}$ denotes the gate oxide capacitance.

Likewise, to characterize the variation in Vt mismatch between two neighboring PFETs of a given circuit design, subthreshold DC voltage characteristic data (Vout vs. Vin) would be measured for each of a plurality of the same/similar circuits comprising device pairs as shown in FIG. 3. In this circumstance, DC transfer curves obtained would be similar to the curves shown in FIG. 5b for Vout vs. Vin, but the curves would be flipped about the vertical axis, as is understood by those of ordinary skill in the art.

The DC data would then be analyzed to determine a distribution of Vin for a given Vout, and a distribution for Vt mismatch would be determined using the determined distribution of Vin. In accordance with the present invention, it has been demonstrated that the distribution of Vin corresponds to the distribution of the Vt mismatch between PFET devices. More specifically, FIG. 6 depicts an analytical model for characterizing Vt mismatch variation between neighboring PFETS, wherein it is shown that the distribution of Vin is equal to the Vt mismatch between PFET devices (i.e., $Vt_{P2}-Vt_{P1}$) of FIG. 3.

Furthermore, to characterize the variation in Vt mismatch between two neighboring NFET and PFET transistors of a given circuit design, subthreshold DC voltage characteristic data (Vout vs. Vin) would be measured for each of a plurality of identical circuits comprising device pairs as shown in FIG. 4. The DC data would then be analyzed to determine a distribution of Vin for a given Vout, and a distribution for Vt mismatch would be determined using the determined distribution of Vin.

For example, FIG. 7b is an exemplary graphical diagram illustrating subthreshold DC voltage characteristics (Vout vs. Vin) that were measured for a plurality of circuits as depicted in FIG. 4. Using the data shown in FIG. 7b, a distribution of Vin was determined for a given Vout (as indicated by the dotted line). Preferably, Vout is selected to be less than 0.5 VDD. More specifically, in the exemplary diagram of FIG. 7b, Vout is preferably selected for a region where the transfer characteristics (Vout vs. Vout) are essentially linear across Vin. In the region of the selected Vout in FIG. 7b, the DC curves (Vout vs. Vin) are linear, but the curves become more nonlinear as Vout is increased or decreased in relation to the dotted line.

Then, for the selected Vout, the distribution of Vt mismatch is determined using the measured distribution of Vin. More specifically, in accordance with the present invention, it has been determined that the distribution of Vin corresponds to the distribution of one-half (½) the Vt mismatch between an NFET and PFET device. FIG. 7a depicts an analytical mismatch model for the data plotted in FIG. 7b. As is shown in FIG. 7a, the distribution of Vin is equal to ½ the Vt mismatch between the devices (i.e., $(Vt_{N1}-Vt_{P1})/2$) shown in FIG. 4.

Figure 10:
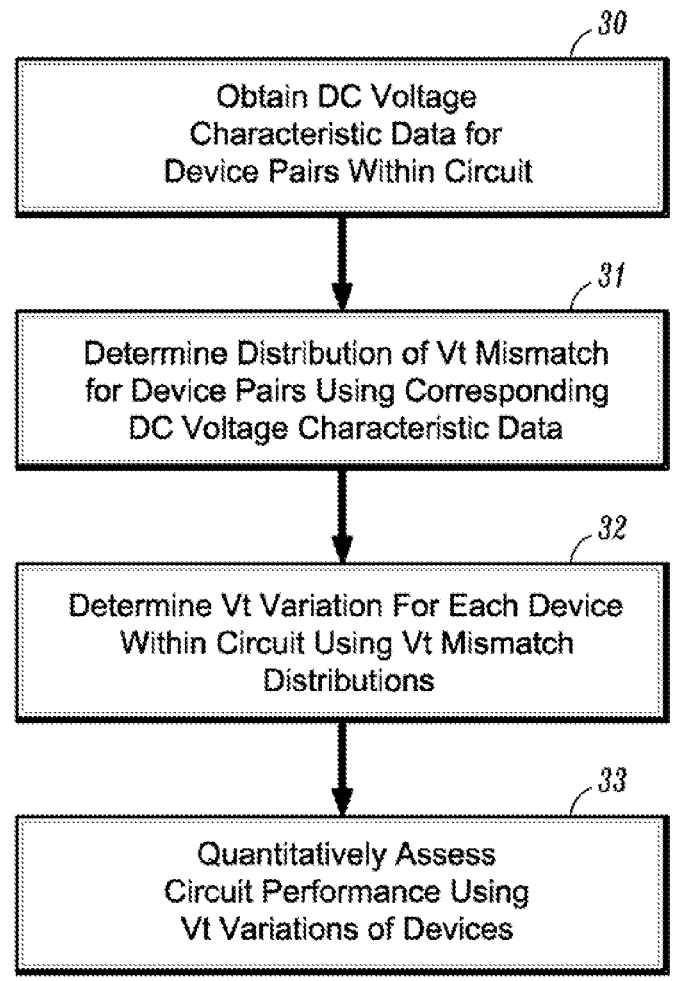
FIG. 10 is a flow diagram of a method for characterizing random variation in Vt of a semiconductor integrated circuit, according to an embodiment of the invention.

FIG. 10 is a high-level flow diagram illustrating a method for characterizing random Vt variation of a semiconductor integrated circuit according to an embodiment of the invention. In general, characterization of random Vt variation of a given semiconductor integrated circuit can be quantitatively assessed by determining a random Vt variation for each transistor of the circuit. Preferably, to determine the random Vt variation of the circuit transistors, the method of FIG. 10 implements the methods described herein for characterizing Vt mismatch of transistor pairs using subthreshold DC voltage characteristics, wherein the distributions of Vt mismatch between various transistor pairs within the circuit are first measured, and then used for determining the random Vt variation for each transistor in the circuit.

A method for characterizing the random Vt variation of a semiconductor integrated circuit according to an embodiment of the invention will now be described in detail with reference to FIG. 10. For purposes of illustration, the method of FIG. 10 will be described with reference to an exemplary embodiment for characterizing random Vt variation of a conventional 6-transistor (6-T) SRAM cell. Referring to FIG. 10, a preferred characterization process begins by obtaining DC voltage characteristic data for various device pairs of a given circuit (step 30) and then determining a distribution of Vt mismatch for each of the device pairs using the corresponding DC voltage characteristic data (step 31).

The DC voltage characteristic data may be obtained by retrieving previously measured test data that is stored in a database. Preferably, the test data is collected using various test circuits (which are preferably similar to the desired circuit design) for measuring subthreshold DC voltage characteristic data for different transistor pairs in the circuit.

By way of example, the exemplary device pairs illustrated in FIGS. 2, 3 and 4, are commonly found in 6-transistor SRAM cells, as well as other semiconductor integrated circuit devices that comprise NMOS and/or PMOS transistors. Accordingly, to characterize the random Vt variation of a 6-T SRAM cell, various test circuits of a 6-T SRAM cell can be constructed for measuring subthreshold DC voltage characteristics for different transistor pairs in the SRAM cell and then determining the Vt mismatch distribution of neighboring transistors in the 6-T SRAM cell using, for example, the methods described above with reference to FIGS. 2-7. FIGS. 11, 12, 13 and 14 are examples of test circuits that can be used for measuring DC voltage characteristics of different transistor pairs of a conventional 6-T SRAM Cell. As explained below with reference to FIG. 15, multiple implementations of the test circuits of FIGS. 11-14 are preferably incorporated within a testing apparatus, such as the exemplary testing apparatus depicted in FIG. 15, for obtaining sufficient DC voltage characteristic data for statistical analysis.

Figure 11:
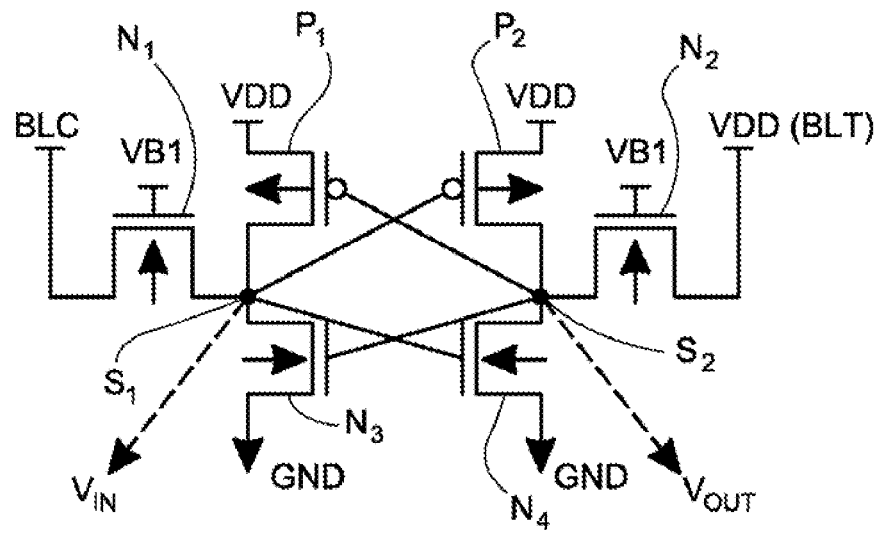
FIG. 11 is an exemplary circuit diagram of a circuit that can be used for characterizing device mismatch of transistors pairs of an SRAM cell, according to an embodiment of the invention.

FIG. 11 illustrates a conventional 6-T SRAM cell. The SRAM cell comprises a pair of NMOS access transistors N1 and N2 that allow data bits on bitline pair BLC, BLT to be read and written to storage nodes S1 and S2, respectively. The gate terminals of access (AC) transistors N1 and N2 are commonly connected to a wordline. The SRAM cell further comprises NMOS pull-down transistors N3 and N4, which are coupled in a positive feedback configuration with PMOS pull-up transistors P1 and P2. The operation of a 6-T SRAM cell is well-known in the art.

FIG. 11 further illustrates an exemplary test circuit that can be constructed for measuring subthreshold DC voltage characteristics of NMOS transistor pair N2 and N4 of the 6 T SRAM cell using the methods described above with reference to FIG. 2 to determine the distribution of random Vt mismatch between the NFETs N2 and N4. More specifically, the DC voltage characteristics, Vout vs. Vin, for the transistor pair N2, N4 are preferably measured by applying a constant voltage VB1 to the gate terminal (wordline) of N2, while sweeping the input voltage, Vin, applied to the gate of N4, and measuring the output voltage, Vout, at storage node S2. In one embodiment, the subthreshold DC voltage characteristics, Vout vs. Vin, for the transistor pair N2, N4 are measured by setting VDD to about 250 mv or 1 v and setting VB1 to a constant voltage of less than about 250 mv, while sweeping Vin from 0 v to a voltage that is less than about 250 mv. These DC voltage measurements are repeated for each of a plurality of the same test circuits of FIG. 11, to thereby obtain a sufficient amount of data to characterize the transistor pair mismatch. Preferably, the data is statistically analyzed (step 31, FIG. 10) to determine the standard deviation of the random distribution of the Vt mismatch of transistor pair N2, N4, that is:

$$\sigma(Vt^{N4}-Vt^{N2}) \tag{1}$$

It is to be appreciated that given the proximity of transistors an SRAM cell, it can be assumed that the measure (1) would be the same or similar with respect to the transistor pair comprising pull-down (PD) transistor N3 and access (AC) transistor N1. Therefore, for transistor pairs (N4, N2) and (N3, N1), measure (1) can be generally represented as:

$$\sigma(Vt^{PD}-Vt^{AC}) \tag{1a}$$

Figure 12:
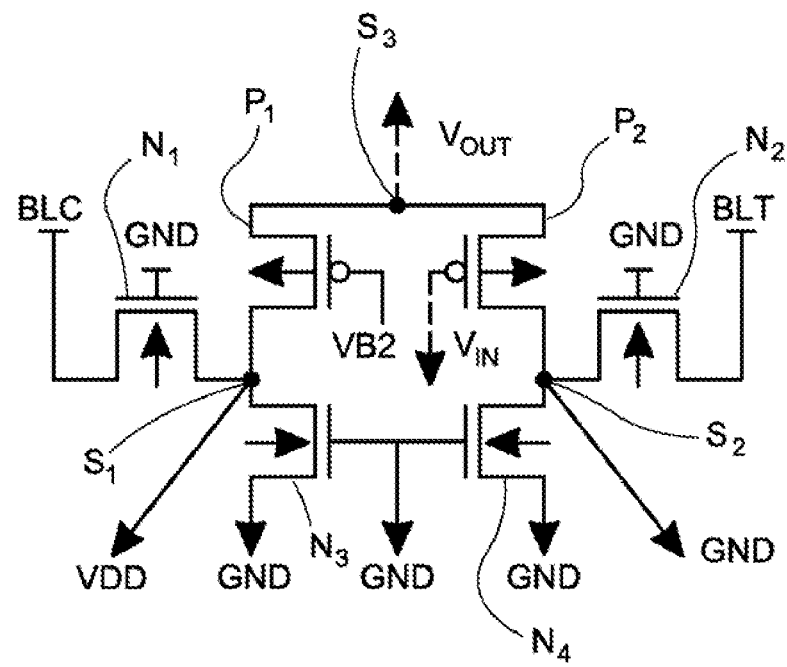
FIG. 12 is an exemplary circuit diagram of a circuit that can be used for characterizing device mismatch of transistors pairs of an SRAM cell, according to another embodiment of the invention.

Next, FIG. 12 illustrates an exemplary test circuit that can be constructed for measuring subthreshold DC voltage characteristics of transistor pair P2 and P1 of the 6 T SRAM cell using the methods described above with reference to FIG. 3 to determine the random Vt mismatch distribution between the PFETs P2 and P1. More specifically, the DC voltage characteristics, Vout vs. Vin, for the transistor pair P2, P1 are preferably measured by applying a constant voltage VB2 to the gate terminal of P1, while sweeping the input voltage, Vin, applied to the gate terminal of P2, and measuring the output voltage, Vout, at node S3. Furthermore, in the test circuit of FIG. 12, to accurately measure the Vt variation of the transistor pair P2, P1 and eliminate uncertainties due to leakage currents from other transistors in the circuit, the feedback connections between the storage nodes S1, S2 and gate terminals of storage cell transistors are removed and the gate terminals of transistors N1-N4 are grounded.

In one embodiment, the subthreshold DC voltage characteristics, Vout vs. Vin, for the transistor pair P2, P1 are measured by setting VDD to about 250 mv or 1 v and setting VB2 to a constant voltage less than about 250 mv, while sweeping Vin from 0 v to a voltage that is less than about 250 mv. These DC voltage measurements are repeated for each of a plurality of the same test circuits of FIG. 12, to thereby obtain a sufficient amount of data to characterize the transistor pair mismatch. Preferably, the data is statistically analyzed (step 31, FIG. 10) to measure the standard deviation of the random distribution of the Vt mismatch of transistor pair P2, P1, that is:

$$\sigma(Vt^{P2}-Vt^{P1})=\sqrt{2}\cdot\sigma Vt^{PPU} \tag{2}$$

It is to be appreciated that since the channel length an width of pull-up (PU) transistors P2 and P1 in an SRAM cell are the same, and given the proximity of such pull-up transistors an SRAM cell, it can be assumed that the standard deviation of the Vt mismatch between transistor pair is equal to the square root of 2 multiplied by the Vt distribution of either device.

Figure 13:
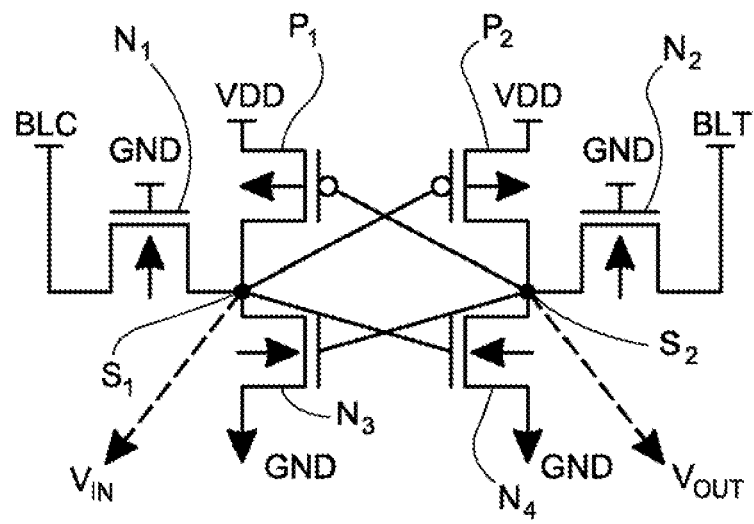
FIG. 13 is an exemplary circuit diagram of a circuit that can be used for characterizing device mismatch of transistors pairs of an SRAM cell, according to another embodiment of the invention.

FIG. 13 illustrates an exemplary test circuit that can be constructed for measuring subthreshold DC voltage characteristics of transistor pair N4 and P2 of the 6 T SRAM cell using the methods described above with reference to FIG. 4 to determine the random Vt mismatch distribution between the transistors N4 and P2. More specifically, the DC voltage characteristics, Vout vs. Vin, for the transistor pair N4, P2 are preferably measured by sweeping the input voltage, Vin, applied to the gates of N4 and P2, and measuring the output voltage, Vout, at storage node S2. In one embodiment, the subthreshold DC voltage characteristics, Vout vs. Vin, for the transistor pair N4, P2 are measured by setting VDD to about 250 mv or 1 v, while sweeping Vin from 0 v to a voltage that is less than about 250 mv. These DC voltage measurements are repeated for each of a plurality of the same test circuits of FIG. 13, to thereby obtain a sufficient amount of data to characterize the transistor pair mismatch. Preferably, the data is statistically analyzed (step 31, FIG. 10) to measure the standard deviation of the random distribution of the Vt mismatch of transistor pair N4, P2, that is:

$$\sigma(Vt^{N4}-Vt^{P2}) \quad (3)$$

It is to be appreciated that given the proximity of transistors an SRAM cell, the measure (3) would be the same or similar with respect to pull-down (PD) transistor N3 and pull-up (PU) transistor P1. Therefore, for transistor pairs (N4, P2) and (N3, P1), measure (3) can be generally represented as:

$$\sigma(Vt^{PD}-Vt^{PU}) \quad (3a)$$

Figure 14:
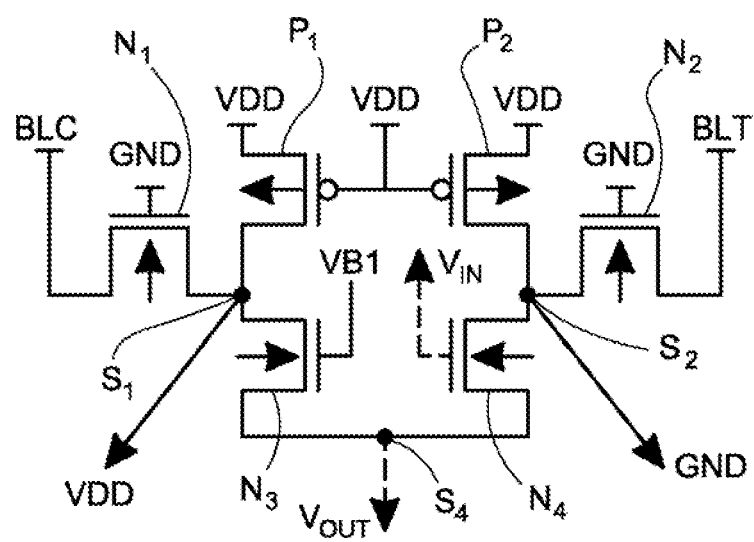
FIG. 14 is an exemplary circuit diagram of a circuit that can be used for characterizing device mismatch of transistors pairs of an SRAM cell, according to another embodiment of the invention.

FIG. 14 illustrates an exemplary test circuit that can be constructed for measuring subthreshold DC voltage characteristics of transistor pair N3 and N4 of the 6 T SRAM cell using the methods described above with reference to FIG. 2 to determine the random Vt mismatch distribution between the NFETs N3 and N4. More specifically, the DC voltage characteristics, Vout vs. Vin, for the transistor pair N3, N4 are preferably measured by applying a constant voltage VB1 to the gate terminal of N3, while sweeping the input voltage, Vin, applied to the gate of N4, and measuring the output voltage, Vout, at node S4. In one embodiment, the subthreshold DC voltage characteristics, Vout vs. Vin, for the transistor pair N3, N4 are measured by setting VDD to about 250 mv or 1 v and setting VB1 to a constant voltage less than about 250 mv, while sweeping Vin from 0 v to a voltage that is less than about 250 mv. These DC voltage measurements are repeated for each of a plurality of the same test circuits of FIG. 14, to thereby obtain a sufficient amount of data to characterize the transistor pair mismatch. Preferably, the data is statistically analyzed (step 31, FIG. 10) to measure the standard deviation of the random distribution of the Vt mismatch of transistor pair N4, N3, that is:

$$\sigma(Vt^{N4}-Vt^{N3})=\sqrt{2}\cdot\sigma Vt^{PD} \quad (4)$$

It is to be appreciated that since the channel length an width of pull-down (PD) transistors N4 and N3 in an SRAM cell are designed to be the same, and given the proximity of such pull-down transistors an SRAM cell, it can be assumed that the standard deviation of the Vt mismatch between transistor pair is equal to the square root of 2 multiplied by the Vt distribution of either device.

Referring again to FIG. 10, once the random distributions of Vt mismatch for the desired device pairs are determined (step 31), the measured Vt mismatch distributions are preferably used for determining the random Vt variation for each of the devices in the circuit (step 32). For instance, in the exemplary embodiment of an SRAM cell as described above, measures (1a) and (4) are used for determining $\sigma Vt^{AC}$, measure (2) yields $\sigma Vt^{PU}$, and measure (4) yields $\sigma Vt^{PD}$, for the exemplary voltages noted above. Measures 3a and 4 can also yield $\sigma Vt^{PU}$.

The measured Vt variations can then be used to quantitatively assess/characterize the overall random Vt variation of the circuits and determine the affects of such random Vt variation on circuit performance (step 33).

It is to be understood that the methods described herein for collecting and statistically analyzing subthreshold DC voltage data may be implemented in various forms of hardware, software, firmware, special purpose processors, or a combination thereof. For instance, the method of FIG. 10 may be implemented as an application comprising program instructions that are tangibly embodied on one or more program storage devices (e.g., hard disk, magnetic floppy disk, RAM, ROM, CD ROM, etc.) and executable by any device or machine comprising suitable architecture.

Figure 15A:
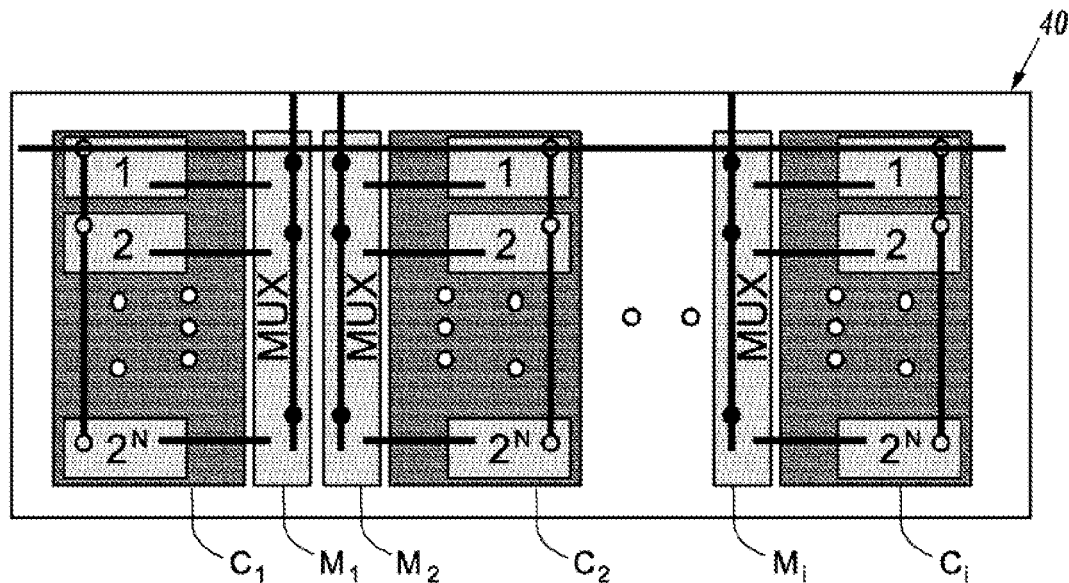
FIG. 15 is a diagram of a testing apparatus according to an embodiment of the invention for measuring device parameters for characterizing device mismatch.

FIG. 15 is an exemplary diagram illustrating a testing apparatus according to an embodiment of the present invention, which can be used for measuring DC voltage characteristic data for test circuits. FIG. 15a illustrates an exemplary testing apparatus (40) comprising a plurality of cell columns (C1, C2, . . . Ci) and a plurality of corresponding multiplexers (M1, M2, . . . Mi). Each cell column Ci comprises a plurality of test circuits $(1, 2, \ldots, 2^N)$ that are constructed for measuring test data. For example, each test circuit in a given column Ci could correspond to any of the circuits depicted in FIGS. 2-4 or FIGS. 11-14. Each column Ci is identical with respect to its constituent test circuits, e.g., test circuit 1 in each column Ci is the same, and so on.

Figure 15B:
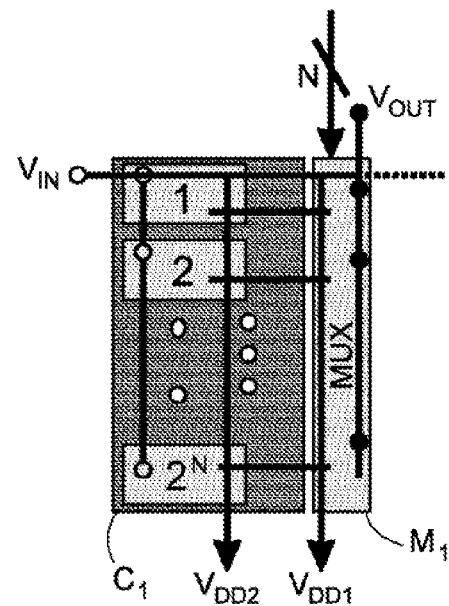

Preferably, each column Ci is designed to include a variety of circuits that would provide sufficient test data to effectively characterize the circuits) under considerations. For instance, each cell column may comprise multiple configurations of the circuits shown in FIGS. 2-4 with variations in channel widths W1, W2, channels lengths L1, L2 and orientation of the device pairs. Furthermore, for measuring DC voltage characteristic data for a 6 T SRAM cell as discussed above, each cell column (Ci) may include multiple configuration of the circuits shown in FIGS. 11-14. For example, assume that N=8 and, thus, there are 1024 cells in each column. Then, in each column Ci, the first 256 cells may comprise the test circuit depicted in FIG. 11, the next 256 cells may comprise the test circuit depicted in FIG. 12, the next 256 cells may comprise the test circuit depicted in FIG. 13, and the last 256 cells may comprise the test circuit depicted in FIG. 14. FIG. 15b illustrates one of the cell columns (e.g., C1) and corresponding multiplexer (e.g., M1) in the testing apparatus (40), although it is understood that all cell columns are identical in structure. As shown in FIG. 15(b), a Vin terminal of the testing apparatus (40) is commonly connected to Vin terminals of each test circuit in the column C1 (as well as the other columns across the testing apparatus). During operation, the multiplexer M1 selects one of the $2^N$ cell Vouts with N address bits using CMOS pass gates of the Multiplexer M1. More specifically, Vout measurements are simultaneously obtained for each corresponding cell in all cell columns across the testing apparatus. Furthermore, a mechanism is provided for applying Vin to only those circuits whose outputs are being selected by the multiplexer. In one embodiment, a decoder that selects a pass-gate in the multiplexer enables only the selected cell corresponding to the pass-gate to be measured. Thus, the multiplexers comprise decoders and pass-gates.

It is to be appreciated that the testing apparatus (40) can be operated under the control of computer or any control system as is known in the art, which can generate control signals (e.g., address bits N) and measure and collect test data that is output from the testing apparatus.

Preferably, the transistors (CMOS pass gates) of the multiplexer M1 are constructed to have long and wide device widths, which significantly reduces/eliminates the uncertainty that could be added to the measured voltage characteristics as a result of leakage currents from the Mux transistors. In addition, the multiplexer M1 preferably operates with a low VDD1 and RBB (reverse body bias) to further reduce the uncertainty that could be added to the measured voltage characteristics. Moreover, the value N can be selected based on the leakage uncertainty from the Mux transistors to Vout.

Figure 8:
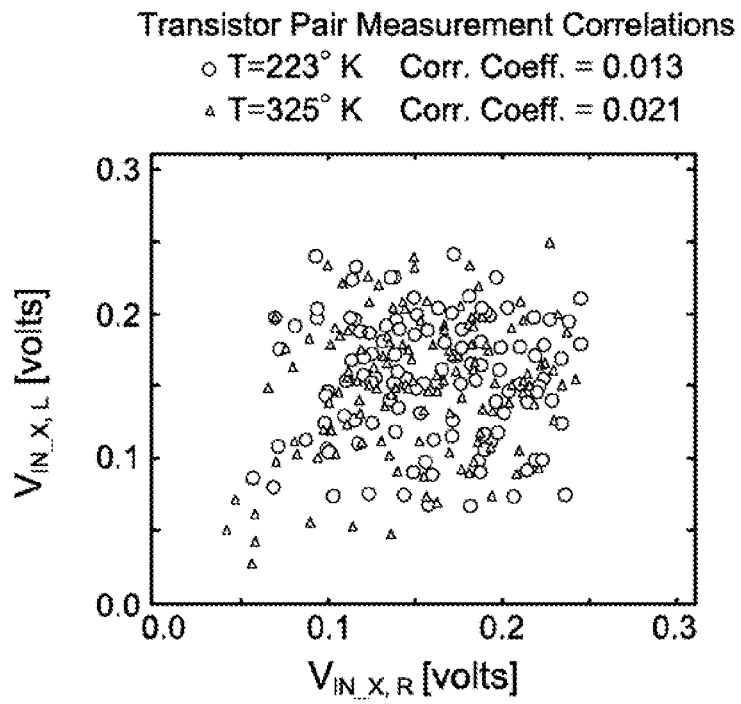
FIG. 8 is an exemplary graphical diagram illustrating correlations of measurements of neighboring pairs of transistors in a SRAM cell to verify that measured variations in device parameters, which are characterized using circuits and methods of the invention, are the result of random sources.

To verify that the measurements shown in FIGS. 5b and 7b, for example, were the result of random sources and not systematic (manufacturing) sources, the Vt mismatch for the right side of an SRAM cell was compared with the Vt mismatch for the left side of the SRAM cell and the data was plotted. FIG. 8 is an exemplary graphical diagram illustrating correlations of measurements of neighboring pairs of transistors in a SRAM cell to verify that measured variations in device parameters, which are characterized using circuits and methods of the invention, are the result of random sources. If the variation was due to systematic sources, there would be spatial correlation. For instance, the measured Vin as shown in FIG. 5b or 7b for each characteristic would move in the same direction for the left or right side of the cell, due to spatial correlation of systematic sources of variation, i.e., the mismatch of two neighboring devices would move in the same direction due to systematic sources of variation. However, as shown in FIG. 8, the correlation coefficients were determined to be less than 0.05, which indicates a marginal correlation between data measurements between the right and left side of the cell (i.e., the variations are overwhelmingly random).

Figure 9:
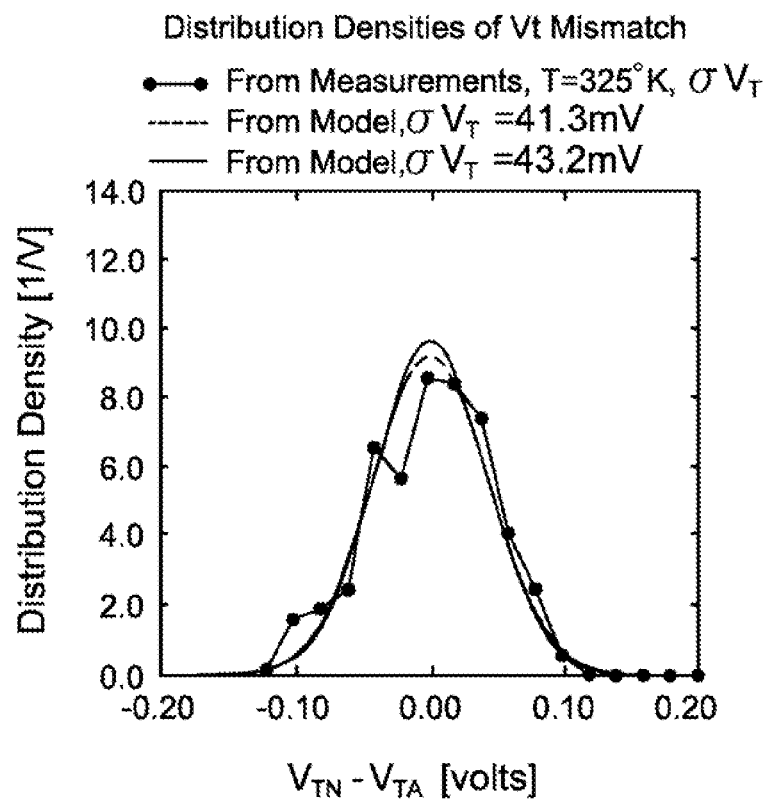
FIG. 9 is an exemplary graphical diagram comparing the distribution densities of Vt mismatch that are obtained using conventional models of dopant fluctuations, with a distribution density of Vt mismatch as measured using circuits and methods according to the invention for characterizing Vt mismatch.

FIG. 9 is an exemplary graphical diagram comparing the distribution densities of Vt mismatch that were obtained using conventional models of dopant fluctuations, with a distribution density of Vt mismatch as measured using circuits and methods according to the invention for characterizing Vt mismatch. In particular, FIG. 9 depicts the measured distribution of Vt mismatch that was obtained using the data shown in FIGS. 5b and 7b as compared with analytical models for Vt variations that are obtained from dopant fluctuations. As shown in FIG. 9, the measured distribution is similar to the distributions determined from the analytical models. Thus, it can reasonably be concluded that the circuits and methods described herein in accordance with the present invention effectively measure random sources of variation due to dopant fluctuations, which is a primary source for random Vt variation in neighboring devices.

Although exemplary embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for characterizing device mismatch in a semiconductor integrated circuit, comprising the steps of:
obtaining DC voltage characteristic data for one or more device pair of an integrated circuit, the device pair selected by a testing apparatus and coupled to a test circuit of the testing apparatus, wherein each of the device pair comprises neighboring first and second transistors in the integrated circuit, wherein the DC voltage characteristic data for the selected device pair comprises an output DC voltage $V_{OUT}$ as a function of an input DC voltage $V_{IN}$, wherein $V_{IN}$ is applied to a gate of at least one of the first and second transistors and wherein $V_{OUT}$ is obtained at a common node connection of the first and second transistors, and wherein the DC voltage characteristic data is obtained with the first and second transistor devices operating in a subthreshold region;

determining a distribution of Vt (threshold voltage) mismatch for the selected device pair using corresponding DC voltage characteristic data for the selected device pair;
determining a Vt variation of transistors in the integrated circuit using one or more determined distributions of Vt mismatch for selected device pairs; and
characterizing random variations of the integrated circuit using one or more determined Vt variations of transistors of the integrated circuit,
wherein the step of determining the distribution of Vt mismatch for the selected device pair using the corresponding DC voltage characteristic data for the device pair, comprises:
determining a distribution of $V_{IN}$ for a given output voltage, $V_{OUT}$; and
determining a distribution of Vt mismatch of the first and second transistors from the distribution of $V_{IN}$,
wherein the distribution of $V_{IN}$ corresponds to a distribution of one-half the Vt mismatch between the first and second transistors when the first and second transistors comprise an NFET and PFET.

2. The method of claim 1, wherein the step of obtaining DC voltage characteristic data for the selected device pair of an integrated circuit comprises applying a constant gate voltage to a gate of the first transistor and varying $V_{IN}$ applied to a gate of the second transistor such that the first and second transistors of the device pair are maintained in a subthreshold region of operation; and
determining $V_{OUT}$ as a function of the varying $V_{IN}$.

3. The method of claim 1, wherein the step of obtaining DC voltage characteristic data for the selected device pair comprises separately measuring DC voltage characteristic data for each of a plurality of similar device pairs.

4. The method of claim 1, wherein the step of obtaining DC voltage characteristic data for the selected device pair comprises:
varying $V_{IN}$ applied to gates of the first and second transistors such that the first and second transistors of the device pair are maintained in a subthreshold region of operation; and
determining $V_{OUT}$ as a function of the varying $V_{IN}$.

5. The method of claim 1, wherein the integrated circuit comprises an SRAM (static random access memory) cell.

6. The method of claim 1, wherein the step of determining the Vt variation of transistors in the integrated circuit comprises determining a standard deviation of Vt variation of the transistors.

7. A non-transitory program storage device readable by a machine, tangibly embodying a program of instructions executable by the machine to perform method steps for characterizing device mismatch in a semiconductor integrated circuit, the method steps comprising:
obtaining DC voltage characteristic data for one or more selected device pair of an integrated circuit, wherein each of the device pair comprises neighboring first and second transistors in the integrated circuit, wherein the DC voltage characteristic data for a selected device pair comprises an output DC voltage $V_{OUT}$ as a function of an input DC voltage $V_{IN}$, wherein $V_{IN}$ is applied to a gate of at least one of the first and second transistors and wherein $V_{OUT}$ is obtained at a common node connection of the first and second transistors, and wherein the DC voltage characteristic data is obtained with the first and second transistor devices operating in a subthreshold region;

determining a distribution of Vt (threshold voltage) mismatch for the selected device pair using corresponding DC voltage characteristic data for the selected device pair;

determining a Vt variation of transistors in the integrated circuit using one or more determined distributions of Vt mismatch for selected device pairs; and characterizing random variations of the integrated circuit using one or more determined Vt variations of transistors of the integrated circuit, wherein the instructions for determining the distribution of Vt mismatch for the selected device pair using the corresponding DC voltage characteristic data for the device pair, comprise instructions for performing the steps of:

determining a distribution of $V_{IN}$ for a given output voltage, $V_{OUT}$; and determining a distribution of Vt mismatch of the first and second transistors from the distribution of $V_{IN}$, wherein the distribution of $V_{IN}$ corresponds to a distribution of one-half the Vt mismatch between the first and second transistors when the first and second transistors comprise an NFET and PFET.

8. The program storage device of claim 7, wherein the instructions for performing the step of obtaining DC voltage characteristic data for the selected device pair comprise instructions for separately measuring DC voltage characteristic data for each of a plurality of similar device pairs.

9. The program storage device of claim 7, wherein the instructions for obtaining DC voltage characteristic data for the selected device pair comprise instructions for performing the steps of:

varying $V_{IN}$ applied to gates of the first and second transistors such that the first and second transistors of the device pair are maintained in a subthreshold region of operation; and determining $V_{OUT}$ as a function of the varying $V_{IN}$.

10. The program storage device of claim 7, wherein the instructions for obtaining DC voltage characteristic data for the selected device pair of an integrated circuit comprise instructions for performing the steps of:

applying a constant gate voltage to a gate of the first transistor and varying $V_{IN}$ applied to a gate of the second transistor such that the first and second transistors of the device pair are maintained in a subthreshold region of operation; and determining $V_{OUT}$ as a function of the varying $V_{IN}$.

11. The program storage device of claim 7, wherein the instructions for determining the Vt variation of transistors in the integrated circuit comprise instructions for determining a standard deviation of Vt variation of the transistors.

* * * * *